(12) United States Patent
Park et al.

(10) Patent No.: US 6,538,263 B1
(45) Date of Patent: Mar. 25, 2003

(54) POLYMER ELECTROLUMINESCENT DEVICE EMPLOYING EMISSIVE IONOMER-TYPE POLYMER

(75) Inventors: O-Ok Park, Taejon (KR); Tae-Woo Lee, Pusan (KR)

(73) Assignee: Korea Advanced Institute of Science and Technology, Taejon (KR)

( * ) Notice: Subject to any disclaimer, the term of this patent is extended or adjusted under 35 U.S.C. 154(b) by 0 days.

(21) Appl. No.: 09/868,733

(22) PCT Filed: Oct. 18, 2000

(86) PCT No.: PCT/KR00/01174

§ 371 (c)(1),
(2), (4) Date: Jun. 18, 2001

(87) PCT Pub. No.: WO01/29115

PCT Pub. Date: Apr. 26, 2001

(30) Foreign Application Priority Data

Oct. 18, 1999 (KR) .............................. 99-45135

(51) Int. Cl.$^7$ ...................... H01L 35/24; B32B 27/00
(52) U.S. Cl. ...................... 257/40; 313/504; 313/506
(58) Field of Search .................. 257/40, 103; 313/504, 313/506; 428/917

(56) References Cited

U.S. PATENT DOCUMENTS 5,408,109 A  4/1995 Heeger et al. ............... 257/40
6,259,201 B1 * 7/2001 Lee et al. .................... 313/504

OTHER PUBLICATIONS

Curtis, et al., N–Methylated Poly(nonylbithiaxole): A New n–Dopable, Conjugated Poly(ionomer), Chem. Mater., 1998, 10, 13–16.

Karasz, et al., Tunable electroluminescence from ionomers doped with cationic lumophores, Electrochimica Acta, vol. 43, Nos. 10–11, pp 1623–1628, 1998.

Lee, et al., Polymer light–emitting diode with ionic material as an electron injecting and hole blocking layer, Mol. Cryst. Liq. Cryst. 1998, vol. 316, pp 277–280.

Gram, et al., *Realization of a Blue–Light–Emitting Device Using Poly(p–phenylene)*, Adv. Mater, 4(1):36–37 (1992).

Cimrove, et al., *Efficient Blue Light Emitting Devices Based on Right–Rod Polyelectrolytes*, Adv. Mater., 8(7):585–588 (1996).

Lee, et al, *Use of ionomer as an electron injecting and hole blocking material for polymer light–emitting diode*, Appl. Phys. Lett., 72(19):2382–2384 (1998).

* cited by examiner

Primary Examiner—Minh Loan Tran

(57) ABSTRACT

The present invention provides ionomer-type emissive polymer whose heat-stability is improved by the formation of ionic cross-link, and electroluminescent device employing the same as an emissive layer. The ionomer-type emissive polymer is characterized by an ionomeric conformation, which has a backbone in a conjugate, non-conjugate or conjugate/non-conjugate multi-block conformation with or without a side chain in a conjugate or non-conjugate conformation, and 0.1 to 15% (mol/mol) of ions bound to the backbone or side chain of the emissive polymer with or without linker. The electroluminescent diode employing ionomer-type emissive polymer can be applied to the preparation of long-life and electricity-saving electroluminescent display device since it can luminesce at low voltage due to its ionomeric conformation and have higher heat-stability than the conventional ones.

24 Claims, 1 Drawing Sheet

POLYMER ELECTROLUMINESCENT DEVICE EMPLOYING EMISSIVE IONOMER-TYPE POLYMER

BACKGROUND OF THE INVENTION

1. Field of the Invention

The present invention relates to an ionomer-type luminescent polymer and polymeric electroluminescent devices employing the same, more specifically, to an ionomer-type luminescent polymer whose heat-stability is improved by the formation of ionic cross-linkage, and electroluminescent devices employing the same as a luminescent layer.

2. Background of the Invention

Most of the luminescent materials used for polymeric electroluminescent devices are not linked to ions. The luminescent materials are, depending on the backbone structure, generally classified into conjugated polymer, non-conjugated luminescent polymer, and conjugated/non-conjugated multi-block copolymer with alternating conjugated and non-conjugated parts. Conjugated luminescent polymers having π-conjugated double bond backbone, includes poly(1,4-phenylenevinylene, PPV) (see: U.S. Pat. No. 5,247,190) and its derivatives, derivatives of poly(para-phenylene) (see: G. Grem et al, *Advanced Materials*, 4(36), 1992), derivatives of polythiophen(see: U.S. Pat. No. 5,540,999), and derivatives of polyphlorene(see: U.S. Pat. No. 5,876,864). Non-conjugated luminescent polymers have non-luminescent backbone connected to luminescent side chains with fluorescent materials such as anthracene, to give electroluminescence corresponding to a luminescent region attributed by the fluorescent material. On the other hand, luminescent polymers made of conjugated/non-conjugated multi-block have a structure in which the length of the conjugation is made short to create blue-shift of luminescent region.

Most of polymeric electroluminescent devices, however, are proven to be less satisfactory in the senses that they are able a to emit blue light only at more than 10 V, and have short life span. As an alternative, Vera Cimnova et al. has reported water-soluble, ionic luminescent polymers by introducing ionic groups into backbone in the form of electrolytes. However, they still revealed a shortcoming of short life-span, owing to the unstable nature of polymers in the environment of water and high temperature(see: Vera Cimnova at al., *Applied Materials*, 8, 585, 1996).

Therefore, there are strong reasons for developing and exploring novel luminescent polymers that can emit light at a low voltage, while enjoying long life-span.

SUMMARY OF THE INVENTION

The present inventors have made an effort to provide luminescent polymers of long life-span that can emit light at a low voltage, and discovered that ionomer-type luminescent polymers prepared by introducing ionic groups into luminescent polymers can emit light at a low voltage, and have higher stability to water and long life-span.

A primary object of the present invention is, therefore, to provide ionomer-type luminescent polymers.

The other object of the invention is to provide electroluminescent devices employing a luminescent layer of ionomer-type electroluminescent polymer.

EXPLANATION OF MAJOR PARTS OF THE DRAWING

Figure 1:
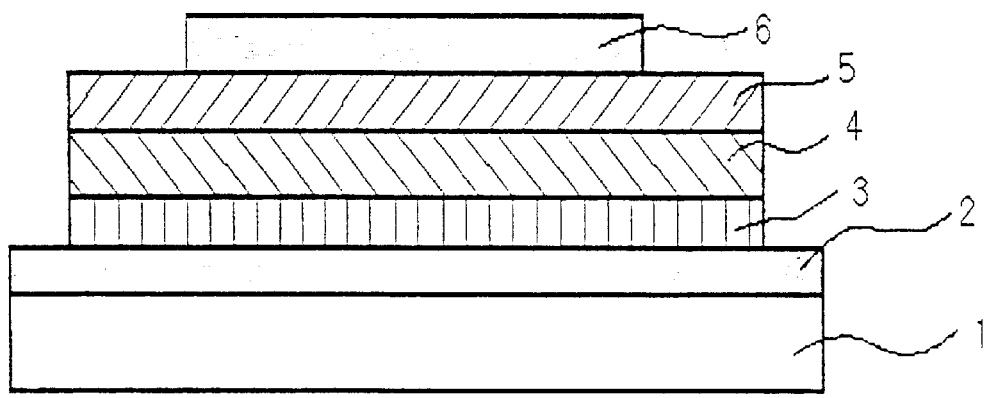
FIG. 1 depicts a cross-sectional view of an electroluminescent device or present invention.

1: panel
2: translucent electrode
3: hole carrier layer
4: luminescent layer
5: electron carrier layer
6: metal electrode

DETAILED DESCRIPTION OF THE INVENTION

An ionomer-type luminescent polymers of present invention is characterized by an improvement in a luminescent polymer in which a backbone having conjugated, non-conjugated, or conjugated/non-conjugated multi-block structure is bound with or without conjugated or non-conjugated side chains, that 0.1 to 15% (mol/mol) ions are introduced into the backbone or side chains of the luminescent polymer to give an ionomer-type luminescent polymer in which the backbone or side chains are connected to ions directly or indirectly through the linker. The ion concentration should not exceed 15% (mol/mol) to make ionomers insoluble to water. Poly(1,4-phenylenevinylene), poly(para-phenylene), polythiophene, and polyfluorene are preferably used for the conjugated backbone while polystyrene (PS) is preferred for the non-conjugated backbone. For linkers, non-conjugated organic luminescent groups are preferred. Ionomers are classified into anionic or cationic ionomers depending on the ions used: In the structure of anionic ionomers, anions such as sulfonyl ($SO_3^-$) carboxyl ($-CO_2^-$) or metal ion groups, are connected to backbone or side chains first, and then equimolar amount of cations are bonded to these anions. All kinds of cations that can be bonded to anions may be employed, though alkali metals such as $Li^+$, $Na^+$, $Cs^+$, $K^+$, $Mg^{++}$, $Zn^{++}$, and $Eu^{+++}$, or organic ions such as $N(CH_3)_4^+$ are preferred; and, in the case of cationic ionomers, cations such as $N(CH_3)_4^+$, are connected to backbone or side chains first, and then equimolar amount of anions, such as carboxyl ($-CO_2^-$) group, are bonded to these cations.

Ionomer-type luminescent polymers of present invention includes: first, neither backbone nor side chains are conjugated(see: Chemical formula (I)); secondly, backbone has a conjugated structure, and ions are directly connected to the backbone (see: Chemical formula (II)); thirdly, backbone has a conjugated structure with side chains, and ions are connected to these side chains(see: Chemical formula (III)); fourthly, backbone has a conjugate/non-conjugate multi-block structure(see: Chemical formula (IV)), where ions may be connected to either conjugated or non-conjugated part.

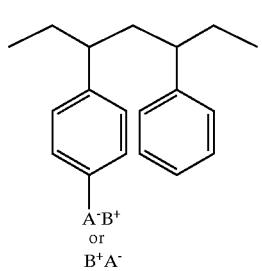

(I)

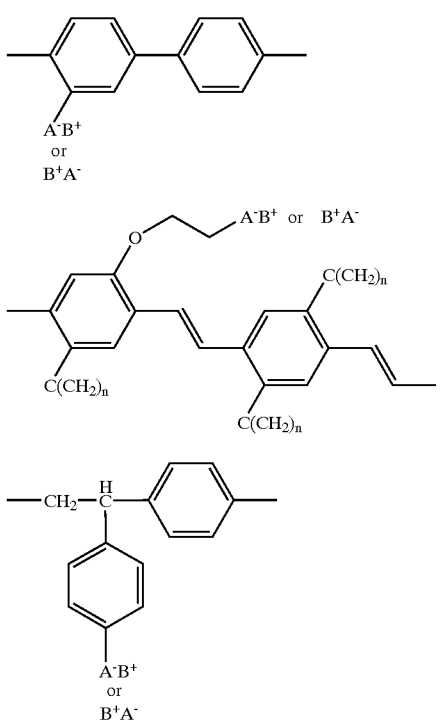

wherein,
A represents an anion;
B represents a cation; and,
n represents a natural number from 1 to 30.

Electroluminescent devices can be prepared by employing ionomer-type luminescent polymers of present invention as a luminescent layer(see: FIG. 1). As clearly depicted in FIG. 1, an electroluminescent device employing luminescent layer or ionomer-type luminescent polymer, consists of a translucent electrode(2), a hole carrier layer(3), a luminescent layer made of ionomer-type luminescent polymer (4), an electron carrier layer(5), and a metal electrode(6), which are sequentially formed on top of a transparent panel(1), or consists of an metal electrode(6) which are formed on a luminescent layer mace of ionomer-type luminescent polymer(4), which in turn is plated on a transparent electrode(2) above a panel(1), where indium-tin oxide(ITO) is preferably used as the translucent electrode.

Electroluminescent devices of the invention can emit light at a low voltage of about 2 V, and also, depending on the type of ion, may emit photoluminescence(PL) with 480 nm wavelength and electroluminescence(EL) with 490 nm wavelength.

The present invention is further illustrated by the following examples, which should not be taken to limit the scope of the invention.

EXAMPLE 1

Preparation of an Ionomer-type Luminescent Polymer with Non-conjugated Backbone

An ionomer-type luminescent polymer with Na$^+$ counterion was prepared by introducing sulfonyl group(SO$^+$) to backbone to the extent of not more than 15% (mol/mol) by the sulfonylation of soluble polyparaphenylene with terphenyl, pentaphenyl, or hexaphenyl group, and then neutralizing the sulfonyl group with methanolic solution of NaOh.

EXAMPLE 2

Preparation of an Ionomer-type Luminescent Polymer with Conjugated Backbone (I)

Conjugated backbone having phenylene structure was bound with side chain of alkoxy group, and to the end of this side chain was polymerized 0.07:9.03 mole ratio of sulfonylated and non-sulfonylated compounds, to prepare an ionomer-type luminescent polymer with Eu counterion.

EXAMPLE 3

Preparation of an Ionomer-type Luminescent Polymer with Conjugated/Non-conjugated Multi-block Structure Conjugated/non-conjugated multi-block backbone structure was formed by polymerizing polystyrene with conjugated thiophene and non-conjugated sulfonylated polystyrene in 9:1 mole ratio, and an ionomer-type luminescent polymer with Li counterion was prepared.

EXAMPLE 4

Preparation of an Ionomer-type Luminescent Polymer with Conjugated Backbone (II)

A conjugated backbone having thiophene structure was bound with side chain of alkoxy group, and to the end of this side chain was sulfonylated and neutralized with Na$^+$ counterion, and a thiophene backbone without side chain, were copolymerized in 1:9 mole ratio, to prepare an ionomer-type luminescent polymer.

EXAMPLE 5

Preparation of an Electroluminescent Device (I)

Lithium sulfonylated polystyrene, non-conjugated polymer with luminescent character was dissolved in dimethylforamide(DMF), and plated on a translucent indiumtin oxide (ITO) electrode of 30 nm thickness formed on a transparent panel by spin-coating method, to prepare a luminescent layer. Then, solvent was evaporated in a vacuum oven, and hen an anionic electrode of aluminium was plated in 100 nm thickness by the aid of a heatplater to give an electroluminescent device.

EXAMPLE 6

Preparation of an Electroluminescent Device (II)

Sodium sulfonylated poly(paraphenylene) (10%, mol/mol) was pated in 6 nm thickness on a translucent ITO electrode formed on a transparent panel to prepare a luminescent layer, and solvent was evaporated for 1 hr at 200° C. in a vacuum oven. Then, organic aluminaquinone compound (Alq3) as an electron carrier layer was plated in 10 nm thickness by the aid of an heatplater, followed by aluminum as an anionic electrode in 100 nm thickness to prepare an electroluminescent device.

EXAMPLE 7

Preparation of an electroluminescent device (III)

Poly(N-vinylcarbazole) was plated in 20 nm thickness on a translucent ITO electrode formed on a transparent panel by spin-coating method to form a hole carrier layer, and solvent was evaporated in a vacuum oven. Sodium sulfonylated poly(paraphenylene) luminescent polymer (10%, mol/mol)

Was plated in 60 nm thickness on top of the hole carrier layer by spin-coating method to prepare a luminescent layer. After drying for 1 hr at 200° C., which is higher than glass transition temperature of plated poly(N-vinylcarbazole) and sodium sulfonated poly(paraphenylene), and anionic electrode of aluminum was plated in 100 nm thickness by the aid of an heatplater to give an electroluminescent device.

When electronic current was applied on the electroluminescent device prepared by Examples 5 to 7 with various voltages, it was found that: the electroluminescent device can emit light at voltages lower than 2 V, which is clearly distinguished from the prior art electroluminescent devices emitting light at voltages higher than 10 V; and, the lifetime is longer than the prior art one by 1.5 times.

As clearly described and demonstrated as above, the present invention provides ionomer-type luminescent polymers characterized by an improvement in a luminescent polymer in which a backbone having conjugated, non-conjugated, or conjugated/non-conjugated multi-block structure is bound with or without conjugated or non-conjugated side chains, that 0.1 or 15% (mol/mol) ions are introduced into the backbone or side chains of the luminescent polymers to give an ionomer-type luminescent polymer in which the backbone or side chains are connected to ions directly or indirectly through the linker, and electroluminescent devices employing the same. Electroluminescent devices employing the ionomer-type luminescent polymers as a luminescent layer can be used for the preparation of long-living and power-saving circuits, since these devices have ionomer structures so that they can emit light at a low voltage, and are more stable to heat than the prior art electroluminescent devices.

Although the preferred embodiments of present invention have been disclosed for illustrative purpose, those who are skilled in the art will appreciate that varous modifications, additions and substitutions are possible, without departing from, the scope and spirit of the invention as disclosed in the accompanying claims.

What is claimed is:

1. An electroluminescent (EL) device, comprising a first electrode, a second electrode and a light-emitting layer between the first and second electrodes, the light-emitting layer comprising an ionomer comprising ionic moieties 0.1 to 15% (mol/mol).

2. The EL device of claim 1, further comprising at least one non-light-emitting layer between the first and second electrodes.

3. The EL device of claim 1, wherein the at least one non-light-emitting layer is selected from the group consisting of a hole-carrier layer and an electron-carrier layer.

4. The EL device of claim 1, wherein at least one of the first and second electrodes is transparent.

5. The EL device of claim 1, further comprising a transparent substrate, wherein at least one of the first and second electrodes is placed on the transparent substrate.

6. The EL device of claim 1, wherein the ionomer is not water-soluble.

7. The EL device of claim 1, wherein the ionomer comprising an ionic cross-linking structure.

8. The EL device of claim 1, wherein the ionomer comprises one or more luminescent substituent groups.

9. The EL device of claim 1, wherein the ionic moieties are selected from the group consisting of organic, inorganic and metallic ions.

10. The EL device of claim 1, wherein the ionic moieties are selected from the group consisting of sulfonyl ($SO_3^-$), carboxyl ($—COO^-$), $N(CH_3)_4^+$ and alkali metallic ions.

11. The EL device of claim 1, wherein the ionic moieties of the ionomer are bonded with or bound to a substantially equimolar amount of counter-charged ions.

12. The EL device of claim 1, wherein the ionomer comprises a backbone with or without one or more side chains connected to the backbone, and wherein one or more of the ionic moieties are attached to the backbone either directly or via one or more of the side chains.

13. The EL device of claim 1, wherein the ionomer comprises a backbone with or without one or more side chains connected to the backbone, and wherein the backbone and the side chains are either conjugated or non-conjugated.

14. The EL device of claim 1, wherein the ionomer comprises one or more blocks selected from the group consisting of polystyrene, polyphenylene, polythiopene and alkoxyl group.

15. A method of making the electroluminescent (EL) device of claim 12, the method comprising:

forming the first electrode on a substrate;

providing a solution of the ionomer dissolved in a solvent;

applying the solution onto a surface over the first electrode;

evaporating the solvent from the solution on the surface, thereby forming the light-emitting layer; and forming the second electrode over the light-emitting layer.

16. The method of claim 15, wherein the ionomer comprises one or more luminescent substituent groups.

17. The method of claim 15, wherein the ionomer is not water-soluble.

18. The method of claim 15, wherein the ionomer comprising an ionic cross-linking structure.

19. The method of claim 15, wherein the ionic moieties are selected from the group consisting of sulfonyl ($SO_3^-$), carboxyl ($—COO^-$), $N(CH_3)_4^+$ and metallic ions.

20. The method of claim 15, wherein the ionic moieties of the ionomer are bonded with or bound to a substantially equimolar amount of counter-charged ions.

21. The method of claim 15, wherein the ionomer comprises one or more blocks selected from the group consisting of polystyrene, polyphenylene, polythiopene and alkoxyl group.

22. A method of emitting light, comprising:

providing the device of claim 1; and applying electrical energy between the first and second electrodes of the device, thereby emitting light from the light-emitting layer comprising the ionomer.

23. The method of claim 22, wherein the device further comprises at least one non-light-emitting layer between the first and second electrodes.

24. The method of claim 22, wherein the ionomer comprises one or more luminescent substituent groups.

* * * * *